United States Patent
Greiser et al.

(10) Patent No.: US 8,975,893 B2
(45) Date of Patent: Mar. 10, 2015

(54) DYNAMIC ADAPTATION OF A DEPHASING GRADIENT PAIR

(75) Inventors: Andreas Greiser, Erlangen (DE); Peter Speier, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 504 days.

(21) Appl. No.: 13/451,956

(22) Filed: Apr. 20, 2012

(65) Prior Publication Data
US 2012/0268125 A1    Oct. 25, 2012

(30) Foreign Application Priority Data
Apr. 21, 2011    (DE) .......................... 10 2011 007 847

(51) Int. Cl.
*G01R 33/44*    (2006.01)
*G01R 33/563*   (2006.01)
*G01R 33/54*    (2006.01)

(52) U.S. Cl.
CPC ........ *G01R 33/56316* (2013.01); *G01R 33/543* (2013.01); *G01R 33/5635* (2013.01)
USPC ........... 324/309; 324/300; 324/306; 324/307; 324/311; 600/410; 600/435; 850/46; 850/47; 850/48; 850/49

(58) Field of Classification Search
CPC ........... G01R 33/56316; G01R 33/543; G01R 33/5635
USPC ........................... 324/300–322; 600/410–435
See application file for complete search history.

(56) References Cited

U.S. PATENT DOCUMENTS

| | | | | |
|---|---|---|---|---|
| 5,226,418 A | * | 7/1993 | Bernstein et al. | 600/419 |
| 5,652,513 A | * | 7/1997 | Liu et al. | 324/306 |
| 5,828,215 A | * | 10/1998 | Boettcher | 324/306 |
| 6,317,620 B1 | * | 11/2001 | Ho et al. | 600/419 |
| 6,408,201 B1 | * | 6/2002 | Foo et al. | 600/410 |
| 6,630,828 B1 | * | 10/2003 | Mistretta et al. | 324/309 |
| 2004/0167394 A1 | | 8/2004 | Assmann | |

OTHER PUBLICATIONS

"A Rapid Look-Up Table Method for Reconstructing MR Images from Arbitrary K-Space Trajectories," Dale et al., IEEE Trans. on Medical Imaging, vol. 20, No. 3 (2001) pp. 207-217.

(Continued)

*Primary Examiner* — Melissa Koval
*Assistant Examiner* — Maxwell A Tibbits
(74) *Attorney, Agent, or Firm* — Schiff Hardin LLP

(57) ABSTRACT

In a method for optimization of a flow coding with switching of an additional bipolar dephasing gradient pair, used in a magnetic resonance (MR) phase contrast angiography, the strength of the flow coding is selected depending on the flow velocity in the vessels that should be depicted. MR signals of an examination region are acquired with continuously running overview measurements, with an operator-selected flow coding strength. After the selected flow coding strength is adopted automatically for the next measurement of the continuously running overview measurements, and two partial measurements with different flow codings are implemented for each selected strength and a phase difference image from the two partial measurements is calculated and depicted in real time, and the selected flow coding strength is automatically adopted for the MR phase contrast angiography.

11 Claims, 3 Drawing Sheets

(56) References Cited

OTHER PUBLICATIONS

"Flow-Gated Phase-Contrast MRI Using Radial Acquisitions," Thompson et al., Magnetic Resonance in Medicine, vol. 52, (2004) pp. 598-604.

"PC VIPR: A High-Speed 3d Phase-Contrast Method for Flow Quantification and High-Resolution Angiography," Gu et al., American Journal of Neuroradiology, vol. 26, (2205) pp. 743-749.

"Handbook of MRI Pulse Sequences," Bernstein et al., (2004) pp. 669-671.

* cited by examiner though only values between −180° and +180° can be shown as phase values, in the phase difference images phase jumps [discontinuities] can result if the selected gradient moment is too large. In order to determine the optimal strength of these bipolar dephasing gradients, overview measurements are applied with varying strengths of the bipolar dephasing gradients. Then, with consideration of the resulting phase difference images, a check is made as to when phase jumps occur in the vessels.

DYNAMIC ADAPTATION OF A DEPHASING GRADIENT PAIR

BACKGROUND OF THE INVENTION

1. Field of the Invention

The present invention concerns a method to optimize a flow coding that is achieved by switching of an additional bipolar dephasing gradient pair that is used in a magnetic resonance phase contrast angiography measurement (data acquisition), wherein the strength of the flow coding is selected depending on the flow rate in the vessels with which the magnetic resonance phase contrast angiography measurement should be depicted. The invention furthermore concerns a MR system to implement the method.

2. Description of the Prior Art

In phase contrast angiography by means of nuclear magnetic resonance, the phase effects of flowing spins are used in order to depict them. These phase effects are based on the fact that, given a bipolar gradient pulse, excited spins that move along a magnetic field gradient have a different phase curve than resting spins. With resting spins, given switching of a bipolar gradient moment the phase is ideally zero after switching this bipolar gradient moment. This does not apply to moving spins since the spin is located in a different position than at the point in time of the negative gradient pulse than at the point in time of the associated positive gradient pulse. Overall, a phase shift that is directly proportional to the speed of the spins results after switching a bipolar gradient pulse. Such bipolar dephasing gradients are switched in MR phase contrast angiography, while the bipolar dephasing gradients are omitted in a further measurement. A difference signal that directly depends on the speed of the moving spins results via a complex difference calculation of the two magnetization vectors. The phase difference that results in such a manner between the overview measurement with bipolar dephasing gradient pair and without dephasing gradient pair is proportional to the speed and can thus be used for quantitative determination of flow velocities. The higher the flow velocity, the greater the phase shift. The greatest phase shift is achieved when the two magnetization vectors from the two overview measurements with and without bipolar dephasing gradient pair are opposite, meaning that the phase difference amounts to 180°. In addition to the flow velocity, the phase difference also depends on the gradient moment of the bipolar dephasing gradient pair, i.e. on the strength and the length of the dephasing gradient pair. Since only values between −180° and +180° can be shown as phase values, in the phase difference images phase jumps [discontinuities] can result if the selected gradient moment is too large. In order to determine the optimal strength of these bipolar dephasing gradients, overview measurements are applied with varying strengths of the bipolar dephasing gradients. Then, with consideration of the resulting phase difference images, a check is made as to when phase jumps occur in the vessels.

Since the flow velocity is typically also coded and compensated only in one spatial direction, the slice plane must be chosen with an adaptation to the vessel anatomy so that the flow takes place in the direction in which the bipolar dephasing gradient pair is switched to code the blood flow. For the user, this means a very time-consuming and laborious preparation, since what strength of the bipolar dephasing gradient pair is the correct one must be discovered according by trial-and-error.

SUMMARY OF THE INVENTION

An object of the present invention is to accelerate the search for the correct bipolar dephasing gradient pair.

According to a first aspect of the invention, a method optimization of a flow coding is provided that is achieved by switching a bipolar dephasing gradient pair, wherein the flow coding is used in a magnetic resonance phase contrast angiography, and wherein the strength of the flow coding is selected depending on the flow velocity in the vessels that should be depicted with the magnetic resonance phase contrast angiography. In a first step of the method, MR signals of an examination region are acquired with continuously running overview measurements, and via an interface an operator can select a strength of the flow coding. After selection of a strength of the flow coding, the selected strength of the flow coding is adopted automatically for the next measurement of the continuously running overview measurements. Two partial measurements with different flow codings are implemented for each selected strength of the flow coding, with a difference of the different flow codings corresponding to the selected strength of the flow coding. In a further step, for each selected strength of the flow coding, a phase difference image is automatically calculated from the two partial measurements. Furthermore, the phase difference image is depicted immediately or as quickly as possible after the acquisition of the two partial measurements, i.e. in real time. If a desired strength of the flow coding has now been identified, the strength of the flow coding is automatically adopted for the MR phase contrast angiography, and the MR phase contrast angiography is implemented with the adopted strength of the flow coding. Through the continuously running overview measurements in which a user can interactively adjust various strengths of the flow coding that is then adopted automatically for the next overview measurement, the search for the ideal flow coding (therefore for the ideal dephasing gradient pair) is significantly accelerated and the measurement result of the subsequent phase contrast angiography is better since the correct bipolar dephasing gradient pair could be identified with very high probability.

In a preferred embodiment, in the overview measurements the raw MR data space or k-space is scanned radially in the acquisition of the MR signals. Radial scanning of raw data space results in only a very few projections of the raw data space having to be measured for the generation of the phase difference image with sufficient signal-to-noise ratio. With only one pair of radial projections, it is possible to generate an image with well identifiable vessels in the calculated phase difference image. The minimum number of projections is typically limited by the signal-to-noise ratio. For example, between 10 and 20 radial projections, preferably between 14 and 16 projections, and more preferably approximately 15 projections, can be measured in raw data space. The two overview measurements—respectively the overview measurements with dephasing gradient pair and the overview measurement without dephasing gradient pair, can be acquired in a very short period of time, and the phase difference image can be generated.

Furthermore, it is possible for the operator to determine a slice plane for the overview measurements via an interface, wherein after selection of a slice plane the selected slice plane is adopted for the next measurement of the continuously running overview measurements. When a desired slice plane and a desired strength of the flow coding were identified (by an operator, for example), the desired slice plane and the strength of the flow coding can be adopted automatically for the MR phase contrast angiography. For example, the desired slice plane can be identified if the user identifies the anatomy shown in the overview measurements as that anatomy that he wants to examine to determine the flow measurement.

For example, the strength of the flow coding can be selected such that a partial measurement with switching of the additional bipolar dephasing gradient pair and another partial measurement without switching of the bipolar dephasing gradient pair are implemented once. Moreover, it is also possible to distribute the flow codings to identical portions (i.e. identical dephasing gradients) in both measurements but with different algebraic signs, such that the desired strength of the flow coding results from the difference of the flow coding of the two partial measurements.

The desired strength of the bipolar dephasing gradient pair can be determined by the user given consideration of the phase difference image, or this can also take place via post-processing of the calculated phase difference images. In one embodiment, the strength of the flow coding decreases from overview measurement to overview measurement, wherein the phase difference images calculated with the varying gradient field strengths are displayed immediately after their calculation. For example, if the continuously running measurements are now halted, the phase difference image upon whose display the continuously running overview measurements were halted can thus be identified. The flow coding of the identified phase image is then adopted automatically for the phase contrast angiography. For example, the identification can be made by the user given consideration of the phase difference images. If this user notes that a phase jump is identified in the vessel in the phase difference image, this user notes that the gradient-induced phase change was so large that it could no longer be shown in the value range from $-\pi$ to $+\pi$ or from $0$ to $2\pi$. In the event that this phase jump is no longer present in the phase values in the vessels in the phase difference image, the strength of the flow coding is selected with the associated bipolar dephasing gradient pair in which this phase jump has simply no longer occurred. This bipolar dephasing gradient pair or the strength of the flow coding is then automatically adopted for the MR phase contrast angiography. It is thus ensured that the correct strength of the bipolar dephasing gradient pair is used automatically for the vessel depiction in the phase contrast angiography.

In a further embodiment, it is also possible to adopt the slice plane of the overview measurement in which the bipolar dephasing gradient pair was already adopted for the MR phase contrast angiography as well. In this case, slice plane and the bipolar dephasing gradient pair are adopted by the overview measurement.

In one embodiment, the image plane is a transversal image plane and the bipolar dephasing gradient pair is switched in the slice selection direction, meaning that flow into or out of the slice plane and orthogonal to the slice plane is hereby identified and quantified. For example, the imaging sequence used in the overview measurement can be a gradient echo sequence.

If the raw data space was scanned radially, the raw data points determined in k-space are not distributed homogeneously in k-space. This has the disadvantage that the application of fast two-dimensional Fourier transformations is not possible. In this context it is possible to distribute the raw data points in k-space homogeneously in raw data space with the aid of a lookup table. The use of such a lookup table is described in detail by B. Dale et al. in "A Rapid Look-up Table Method for Reconstructing MR Images from Arbitrary k-Space Trajectories", IEEE Transaction on Medical Imaging, Vol. 20 No. 3, March 2001, Pages 207-217.

The invention furthermore concerns an MR system to optimize the flow coding that is achieved via the switching of the additional bipolar dephasing gradient pairs. The MR system has an acquisition unit that is equipped to acquire MR signals of an examination subject with multiple continuously running overview measurements. Furthermore, an operating unit is provided with which the user can interactively select a strength of the flow coding, wherein after selection of a strength of the flow coding the acquisition unit adopts the selected strength of the flow coding automatically for the next measurement of the continuously running overview measurements. The acquisition unit is then designed such that two partial measurements with different flow codings are implemented for each selected strength of the flow coding, wherein the difference of the different flow codings corresponds to the selected strength of the flow coding. Furthermore, an image computer is provided that is designed to calculate a phase difference image from the two partial measurements for each selected strength of the flow coding. A display unit presents the phase difference image immediately after calculation. If a desired strength of the flow coding has now been identified, the acquisition unit adopts the strength of the flow coding automatically for the MR phase contrast angiography and implements this with the adopted strength of the flow coding.

DESCRIPTION OF THE PREFERRED EMBODIMENTS

Figure 1:
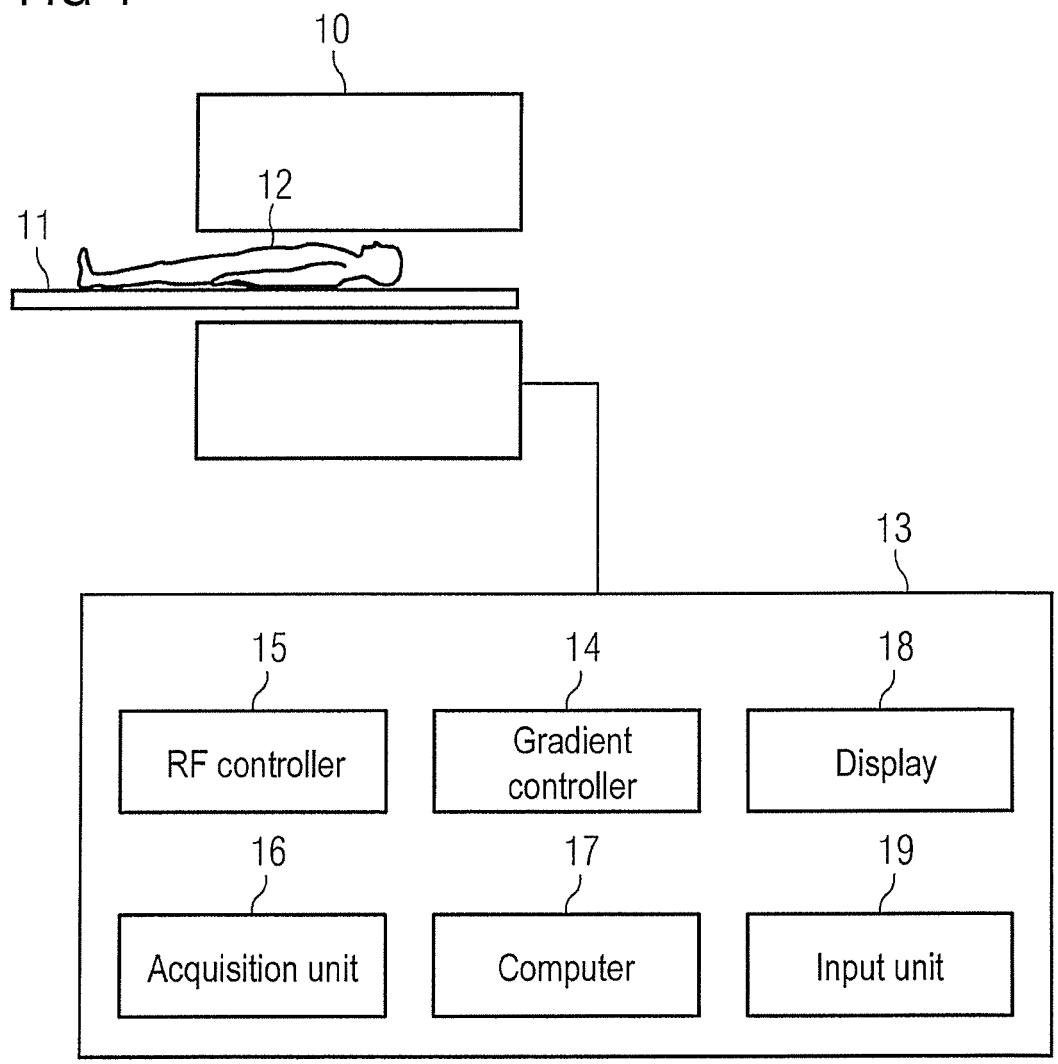
FIG. 1 schematically illustrates an MR system that is operable to optimize an additional bipolar dephasing gradient pair in accordance with the invention.

In FIG. 1, an MR system is shown with which a phase contrast angiography can be prepared effectively and quickly via determination of the correct bipolar dephasing gradient for coding the flow. The MR system has a magnet 10 to generate the polarization field B0. A person 12 to be examined, arranged on a bed 11, is driven into the magnet, and the voltages generated after radiation of RF pulses in connection with switched gradients are detected by a reception coil (not shown) and transferred to a central control unit 13. The central control unit 13 has a gradient controller 14 with which the magnetic field gradients that are necessary for spatial coding of the signals are controlled. An RF controller 15 controls the radiations of the RF fields to generate the MR signals by flipping the magnetization out of the steady state. An acquisition unit 16 controls the workflow of the gradient fields and the radiated RF pulses depending on the selected imaging sequence and thus controls the RF controller 15 and the gradient controller 14. The detected MR signals are converted into MR images in a computer 17 before they are displayed at a display unit 18. Operators can control the workflow of the measurements via an input unit 19. The fundamental operation of an MR system is known to those skilled in the art, and thus need not be described in further detail herein.

Figure 2:
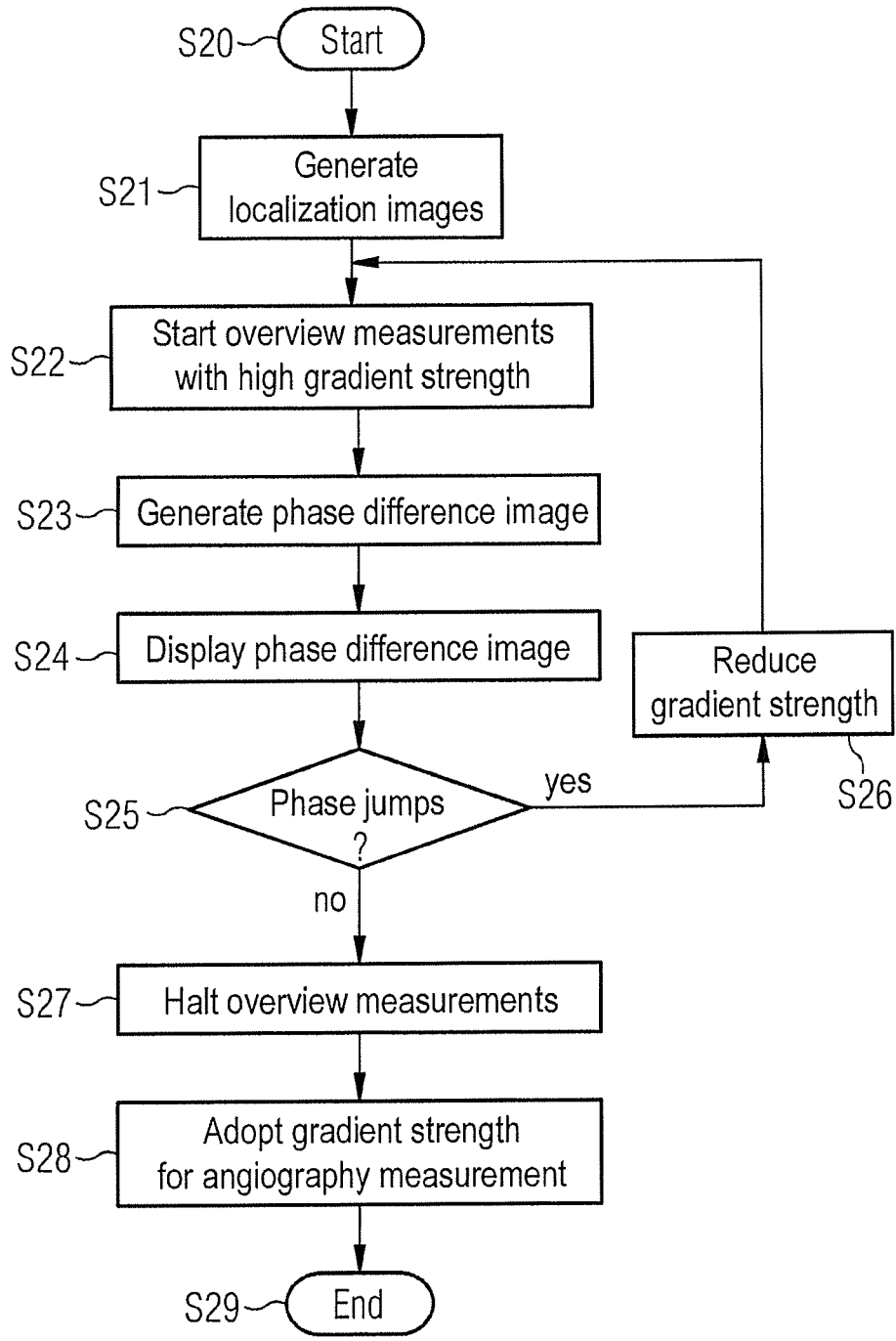
FIG. 2 is a flowchart showing the basic steps to optimize the bipolar dephasing gradient pair in accordance with the invention.
Figure 3:
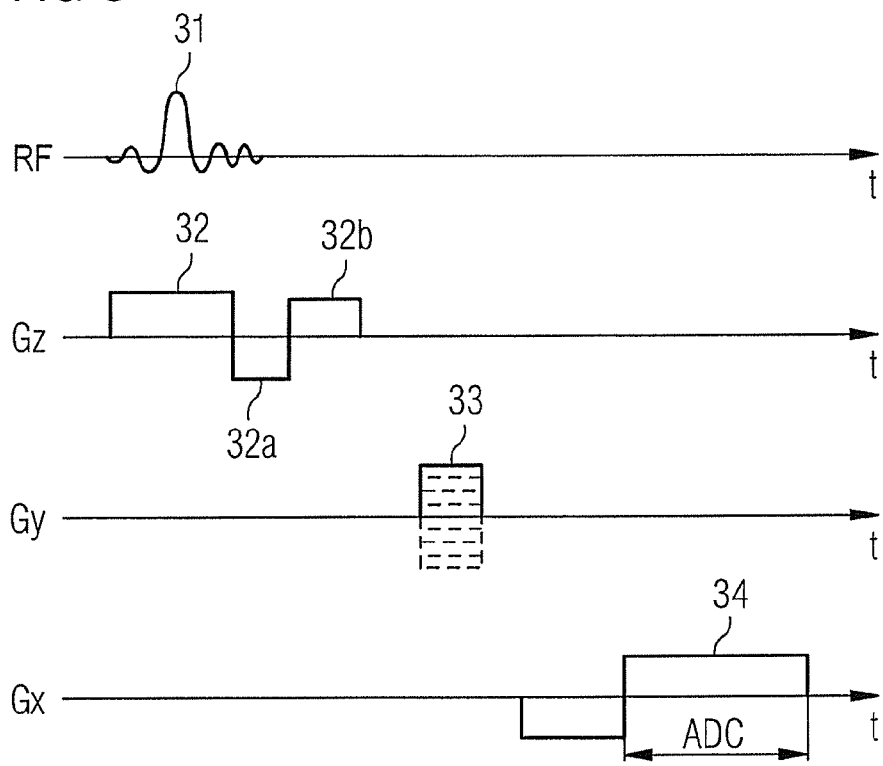
FIG. 3 shows a pulse sequence to create the overview measurements, without an additional bipolar dephasing gradient.
Figure 4:
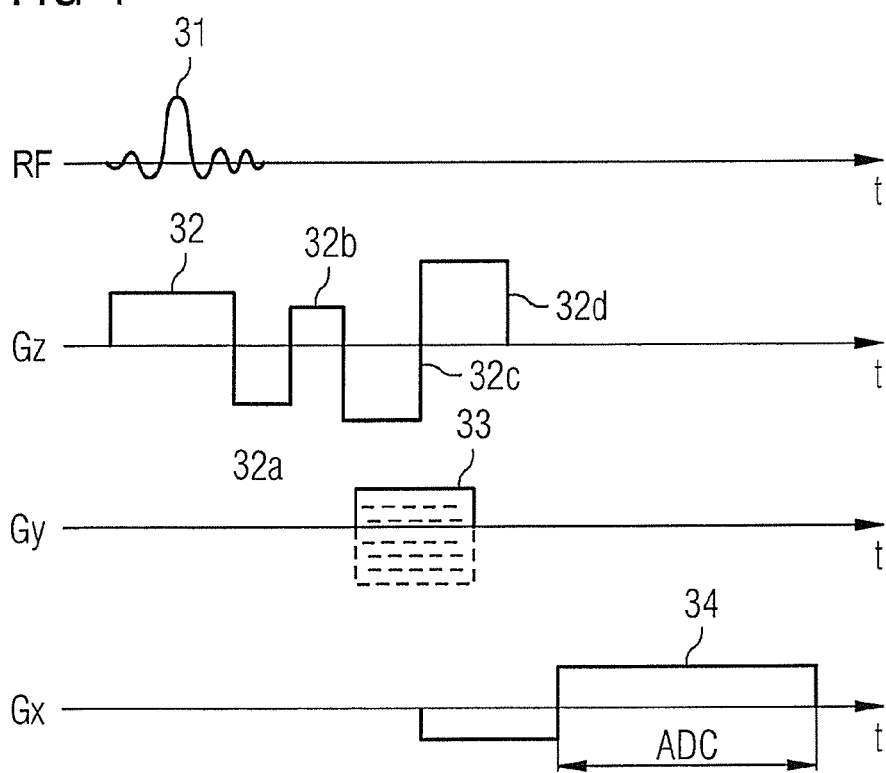
FIG. 4 shows the sequence of FIG. 3 with an additional bipolar dephasing gradient pair.

When MR phase contrast angiography images of the person 12 to be examined are to be generated, localization (overview) images of the person to be examined are generated first in which the position of the phase contrast angiography measurements to be generated can be planned further. FIGS. 2-4 illustrate how an optimization of the additional dephasing gradients necessary for the phase contrast MR angiography is selected in more detail. For example, the flow in the aorta of the examined person should be determined. For this the flow velocities occurring in the aorta must be coded via an additional dephasing gradient (a bipolar dephasing gradient pair) such that the occurring flows are represented in the value range of $2\pi$ overall.

The optimization method necessary to determine the size of the bipolar dephasing gradient pair is explained in detail in connection with FIG. 2. The method starts in Step S20, wherein in Step S21 localization images are generated in which the additional measurements can be planned. Via a human/machine interface, an operator can select a first transversal slice plane at the level of the aorta, wherein in Step S22 the continuously running overview measurements can then be started. In Step S22 one flow-compensated imaging sequence (for example the gradient echo sequence of FIG. 3), and one of the same imaging sequence with additional bipolar dephasing gradients, are switched (activated).

As is shown in FIG. 3, in this gradient echo sequence with radiation of the RF pulse 31 a slice in which the spins are excited by the RF pulse is selected simultaneously in the slice selection direction (here the gradient GZ). This is the gradient switching 32. This gradient switching has at its trailing end another bipolar gradient moment 32a and 32b, whereby spins flowing in the slice selection direction have no velocity-induced phase component given constant velocity. As is typical in a gradient echo sequence, the phase coding gradient 33 is switched at varying strengths in the phase coding direction before the signal is read out via the gradient switching 34 in the readout direction. The imaging sequence shown in FIG. 4 corresponds to the imaging sequence shown in FIG. 3, wherein another bipolar dephasing gradient pair 32c and 32d is additionally switched in the slice selection direction. Spins that run in the direction of the magnetic field gradient GZ have a different phase than resting spins due to these additional dephasing gradients. If a phase image is now generated with the imaging sequence shown in FIG. 3 and a phase image is generated with the imaging sequence used in FIG. 4, and these are subtracted from one another to generate a phase difference image (Step S23 in FIG. 2), the spins flowing in the slice selection direction are coded via the phase change depending on the flow velocity. Via a man/machine interface, a sequence of overview measurements can be started via the input unit 19. In the first overview measurements (once with the sequence according to FIG. 3 and once with the sequence according to FIG. 4), the gradient strength can be adjusted so that the gradient strength is greater than that which would be set give the flow velocity to be expected. For example, via the operating unit the operator can set a first gradient moment for this bipolar gradient pair in the running overview measurements, and after acquisition of the overview measurements and generation of the phase difference images these phase difference images can be displayed in Step S24. If phase jumps still exist in the displayed phase image (S25), the same overview measurement can subsequently be repeated with a slightly reduced gradient strength of the bipolar dephasing gradient pair 32c and 32d.

Via the interactive, interface the operator can reduce the flow coding after display of the phase difference image in Step S24. If the strength of the flow coding is not varied, the measurement is simply repeated with the previously existing strengths. The operator thus has time to study the calculated phase difference images in detail. In Step S22 the largest flow coding or, respectively, the highest gradient strength is hereby started with so that the maximum peripheral nerve stimulation can be predicted before the start of the measurement. When the gradient strength is interactively reduced, it is thereby ensured that peripheral nerve stimulations are avoided. If the gradient strength is reduced in Step S26 and Steps S22-S24 are repeated, in Step S25 it can be checked again whether what is known as "aliasing" (i.e. the phase jumps) still occur. If phase jumps no longer occur, the operator can halt the continuously running overview measurements (Step S27)since the flow coding has been identified that should be used for the subsequent phase contrast angiography measurement. The manual halting of the overview measurements is interpreted to the effect that the suitable flow coding has now been identified, such that the flow coding of the last displayed phase difference image is identified and is adopted for the angiography measurement (Step S28). The method ends in Step S29. The phase contrast angiography can then be implemented with the adopted flow coding (the step is not shown).

Furthermore, via an interactive operating unit, it is possible to change the slice plane for the next overview measurement during the overview measurements. In one embodiment of the invention, not only the strength of the suitable bipolar dephasing gradient pair but also the slice plane of the associated measurement can then be adopted. In the embodiment shown in FIG. 2, this is the measurement in which the measurement was halted upon display of the associated phase difference image. The slice plane and the associated gradient field strengths for the dephasing gradients can then be adopted.

In the embodiment shown in FIG. 2, the determination of the phase jumps is performed by a user of the system. In another embodiment it is also possible (for example via image post-processing algorithms) to identify the vessels in the phase image and then subsequently identify whether phase jumps of $2\pi$ occur in these vessels. If this is the case, as in Steps S27 and S28 the gradient strength of the measurement occurring before this can be adopted.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for optimization of flow coding in magnetic resonance phase contrast angiography, comprising:

via a control unit, operating a magnetic resonance data acquisition unit to acquire magnetic resonance data from at least a portion of a patient in the data acquisition unit by continuously implementing a plurality of overview measurements in succession, and in each overview measurement, acquiring magnetic resonance data with a pulse sequence that comprises a bipolar dephasing gradient pair, and an additional bipolar dephasing gradient pair that determines flow coding, said flow coding having a strength that is dependent on a flow velocity of vessels within the patient to be depicted in magnetic resonance phase contrast angiography;

via an interface of said control unit, allowing an operator to select said strength of said flow coding and, after the strength of the flow coding is selected, automatically setting the additional bipolar dephasing gradient pair in a mixed overview measurement of the continuously implemented overview measurements, to produce the selected strength of said flow coding, and implementing two partial measurements with different flow codings for each selected strength of said flow coding, with a difference between the different flow codings corresponding to the selected strength of the flow coding;

in a processor, for each selected strength of said flow coding, calculating a phase difference image from the two partial measurements;

at a display unit associated with the control unit, depicting the phase difference image in real time and, when a desired strength of the flow coding has been selected, automatically adopting the strength of the flow coding that has been identified for magnetic resonance phase contrast angiography; and via the control unit, operating the magnetic resonance data acquisition unit to implement magnetic resonance phase angiography of the patient with the adopted strength of the flow coding.

2. A method as claimed in claim 1 comprising entering said magnetic resonance data acquired in the overview measurements into k-space by radially scanning k-space.

3. A method as claimed in claim 2 comprising acquiring between 10 and 20 radial projections of k-space for each of said overview measurement.

4. A method as claimed in claim 1 comprising, via said interface, allowing an operator to select a slice plane for said overview measurements and, after selection of said slice plane, automatically adopting the selected slice plane for said mixed overview measurement and, when the selected slice plane and the selected strength of said flow coding have been identified in said phase difference image that is depicted at said display, automatically adopting the selected slice plane for said magnetic resonance phase contrast angiography.

5. A method as claimed in claim 1 comprising via said control unit, causing the strength of said flow coding to iteratively decrease from overview measurement-to-overview measurement, thereby producing changing flow codings in successive overview measurements, and calculating said phase difference images for the respective overview measurements immediately after acquisition of the MR data for the respective overview measurement and, when said continuously implemented overview measurements are stopped, using the phase difference image that occurs when said continuously implemented overview images are stopped to set the strength of the flow coding in said MR phase contrast angiography.

6. A method as claimed in claim 5 comprising, when said continuously implemented overview images are stopped, using the slice plane in the phase difference image at the time said continuously implemented overview measurements were stopped, as the slice plane for said magnetic resonance phase contrast angiography.

7. A method as claimed in claim 1 comprising via said control unit, causing the strength of said flow coding to iteratively decrease from overview measurement-to-overview measurement, thereby producing changing flow codings in successive overview measurements, and calculating said phase difference images for the respective overview measurements immediately after acquisition of the MR data for the respective overview measurement and, when said continuously implemented overview measurements are stopped, using the phase difference image that occurs when a phase difference image in which no phase jump in a vessel is identified for a first time, using the strength of the flow coding in that phase difference image for said magnetic resonance phase contrast angiography.

8. A method as claimed in claim 1 comprising selecting a transverse image plane as a slice plane for said overview measurements and said magnetic resonance phase contrast angiography, and implementing the flow coding in a direction of the selected transverse image plane.

9. A method as claimed in claim 1 comprising entering said magnetic resonance data on each of said overview measurements into k-space by radio scanning and converting radially scanned points in k-space into raw data points that are homogenously distributed in k-space using a look-up table.

10. A method as claimed in claim 1 comprising implementing a gradient echo sequence as said pulse sequence for said overview measurements.

11. A magnetic resonance system for optimization of flow coding in magnetic resonance phase contrast angiography, comprising:

a magnetic resonance data acquisition unit;

a control unit configured to operate said magnetic resonance data acquisition unit to acquire magnetic resonance data from at least a portion of a patient in the data acquisition unit by continuously implementing a plurality of overview measurements in succession, and in each overview measurement, acquiring magnetic resonance data with a pulse sequence that comprises a bipolar dephasing gradient pair, and an additional bipolar dephasing gradient pair that determines flow coding, said flow coding having a strength that is dependent on a flow velocity of vessels within the patient to be depicted in magnetic resonance phase contrast angiography;

an interface of said control unit configured to allow an operator to select said strength of said flow coding and, after the strength of the flow coding is selected, said control unit being configured to automatically set the additional bipolar dephasing gradient pair in a mixed overview measurement of the continuously implemented overview measurements, to produce the selected strength of said flow coding, and implementing two partial measurements with different flow codings for each selected strength of said flow coding, with a difference between the different flow codings corresponding to the selected strength of the flow coding;

a processor configured, for each selected strength of said flow coding, to calculate a phase difference image from the two partial measurements;

a display unit associated with the control unit, said control unit being configured to cause the phase difference image to be depicted at said display unit in real time and, when a desired strength of the flow coding has been selected, automatically adopt the strength of the flow coding that has been identified for magnetic resonance phase contrast angiography; and said control unit being configured to operate the magnetic resonance data acquisition unit to implement magnetic resonance phase angiography of the patient with the adopted strength of the flow coding.

* * * * *